United States Patent [19]

Yoshida et al.

[11] Patent Number: 4,859,908
[45] Date of Patent: Aug. 22, 1989

[54] PLASMA PROCESSING APPARATUS FOR LARGE AREA ION IRRADIATION

[75] Inventors: Akihisa Yoshida, Neyagawa; Kentaro Setsune, Sakai; Takashi Hirao, Moriguchi, all of Japan

[73] Assignee: Matsushita Electric Industrial Co., Ltd., Kadoma, Japan

[21] Appl. No.: 100,148

[22] Filed: Sep. 23, 1987

[30] Foreign Application Priority Data

| | | | |
|---|---|---|---|
| Sep. 24, 1986 | [JP] | Japan | 61-225266 |
| Dec. 19, 1986 | [JP] | Japan | 61-304185 |
| Dec. 19, 1986 | [JP] | Japan | 61-304186 |
| Dec. 19, 1986 | [JP] | Japan | 61-304196 |
| Mar. 2, 1987 | [JP] | Japan | 62-47109 |

[51] Int. Cl.$^4$ .............................................. H01J 27/02
[52] U.S. Cl. ........................... 315/111.81; 313/230; 313/231.31; 313/359.1; 313/161; 315/111.21; 315/111.41
[58] Field of Search ............... 313/230, 231.3, 359.1, 313/360.1, 156, 161; 315/111.2, 111.4, 111.6, 111.7, 111.8, 111.9; 204/298 EE, 298 MN, 298 BD

[56] References Cited

U.S. PATENT DOCUMENTS

| | | | |
|---|---|---|---|
| 2,946,919 | 7/1960 | Lerbs | 313/567 X |
| 3,984,727 | 6/1976 | Young | 315/248 X |
| 4,101,411 | 7/1978 | Suzuki et al. | 204/298 EE |
| 4,438,368 | 3/1984 | Abe et al. | 315/39 |
| 4,543,465 | 9/1985 | Sakudo et al. | 315/111.4 X |
| 4,733,133 | 3/1988 | Dandl | 315/111.4 X |
| 4,757,237 | 7/1988 | Hellblom et al. | 313/231.3 X |

OTHER PUBLICATIONS

Cook, C. J. et al., "Energy Anomalies Observed in Ion Beams Produced by rf Sources," *Review of Scientific Instruments*, vol. 33, (Jun. 1962), pp. 649–652.

Muller, J. C. et al., "Low Cost Ion Implantation for Polycrystalline Silicon Solar Cells," *Proceedings of the European Community Photovoltaic Solar Energy Conference (Luxembourg)*, (Sep. 1977), pp. 897–909.

*Primary Examiner*—James J. Groody
*Assistant Examiner*—Mark R. Powell
*Attorney, Agent, or Firm*—Spencer & Frank

[57] ABSTRACT

A plasma processing apparatus performs various plasma processings of a substrate having a large area in a semiconductor element manufacturing process, by using highly excited plasma generated at a low pressure under the application of RF power and a magnetic field. In this plasma processing apparatus, a gas is introduced into a vacuum chamber to be used as an ion source, RF power is applied to two electrodes having respective surfaces opposite to each other through the gas to thereby generate the plasma in the vacuum chamber, and a magnetic field is applied to the plasma from a magnetic field source arranged at a predetermined position. The intensity of the applied magnetic field is set to be 1.5 times or more the magnetic field intensity which causes electron cyclotron resonance to occur at the frequency f of the applied RF power. Particularly, when the frequency f of the RF power is 13.56 MHz, the magnetic field intensity is selected to be in the range from 25 gausses to 35 gausses.

19 Claims, 8 Drawing Sheets

PLASMA PROCESSING APPARATUS FOR LARGE AREA ION IRRADIATION

BACKGROUND OF THE INVENTION

This invention generally relates to a plasma processing apparatus used for the fabrication of semiconductor devices and the like in the semiconductor industry, and, more particularly, to a plasma processing apparatus suitable for performing, within a short period of time, such processings as uniform injection of impurities into a large area semiconductor device and a large area semiconductor thin film and uniform formation and etching of a large area semiconductor thin film.

For performing doping of a desired amount of impurities in the form of ions into a semiconductor thin film and the like at a desired depth, or formation and etching of a thin film, there have hitherto been available various methods including:

(1) a method using an inductance coupling RF ion source, as disclosed in Review of Scientific Instruments, vol. 33 (1962), pp. 649–652, by C. J. Cook et al, and illustrated in FIG. 9 of the present application;

(2) a method using a compact ion injector, as disclosed in Proceeding of the European Community Photovoltaic Solar Energy Conference (Luxembourg), September 1977, pp. 897–909, by J. C. Muller et al, and illustrated in FIG. 10 of the present application, wherein an ion source utilizing DC glow discharge supplies electrons which are not caused to pass through a mass separation unit, but are accelerated through an ion accelerator unit so as to be injected into a semiconductor substrate or the like; and (3) a method such as illustrated in FIG. 11 of the present application which uses a plasma CVD apparatus wherein capacitance coupling RF electrodes disposed in a vacuum chamber are energized to cause chemical vapour reaction through RF glow discharge, with a DC voltage further applied to the R. F. electrodes by being superimposed on the RF energization voltage.

In the above-described prior art methods of doping impurities in the form of ions into a semiconductor thin film or the like, the first method (1) using the inductance coupling RF ion source shown in FIG. 9 specifically performs ion injection, etc. by forming a focused ion beam which is focused through an ion source aperture of 1 cm or less. However, due to the small diameter of the focused ion beam, electrical scanning of the ion beam, for example, becomes necessary to perform large area processing of a semiconductor thin film, etc. Further, RF power leaks externally and an induced current caused by the RF power leakage flows through the external electromagnetic coil. Consequently, when the RF power is increased, the magnetic field generated by the magnetic coil becomes unstable, giving rise to unstable and nonuniform discharge, and hence it becomes difficult to perform large area processing uniformly within a short period of time.

An example of the compact ion injector used in the second method (2) is shown in FIG. 10. In FIG. 10, reference numeral 600 designates a discharge chamber, 601 a DC power supply for discharging, 602 an anode electrode for causing DC glow discharge, 603 an acceleration electrode, 604 an acceleration power supply, 605 a substrate stand or supporting table, 606 a substrate or like material, 607 a gas inlet conduit, 608 a gas evacuation pipe, and 609 an insulating member.

In the compact ion injector shown in FIG. 10, impurity ions from the ion source utilizing DC glow discharge, which is caused by the application of a DC voltage from the DC power supply 601 across the anode electrode 602 and the acceleration electrode 603, are accelerated by the ion accelerator unit, which effects ion acceleration by a potential difference between the acceleration electrode 603 and the substrate stand 605 provided by the acceleration power supply 604. Then, the impurity ions are injected into a semiconductor substrate or the like without being subjected to mass separation performed by a mass separation unit. In this compact ion injector, however, it is necessary to use a complicated mechanism such as a differential evacuation system to thereby maintain the pressure of the ion source at a reduced pressure of 1 to 0.01 Torr necessary for the ion source to fulfil its function for sustaining DC glow discharge and to maintain a substrate chamber at a pressure of $10^{-3}$ Torr or less at which pressure the mean free path of the ions can exceed the distance between the ion source and a substrate. Further, when the discharge electrodes are made larger to increase the impurity injection area, there occurs nonuniform and unstable discharge due to creeping discharge, etc., which makes it difficult to attain impurity doping with high precision.

An example of the plasma CVD apparatus used in the third method (3) is shown in FIG. 11. In FIG. 11, reference numeral 610 designates a vacuum chamber, 611 an RF electrode, 612 a matching box, 613 an RF oscillator, 614 a DC power supply, 615 a gas inlet conduit, 616 a gas evacuation pipe, 617 a substrate or like material, and 618 a substrate stand.

In the plasma CVD apparatus shown in FIG. 11, the capacitance coupling type RF electrode 611 contained in the vacuum chamber 610 is supplied with RF power from the RF oscillator 613 and gives rise to a chemical vapour reaction by RF glow discharge within the vacuum chamber 610. Further, the substrate stand 618 acting as the other capacitance coupling type RF electrode is supplied with an acceleration DC voltage from the DC power supply 614. With the above-mentioned structure, impurity ions generated by the RF glow discharge are doped into the substrate 617. In this plasma CV apparatus, the internal pressure of the vacuum chamber 610 is maintained at 1 to 0.01 Torr in order to sustain the RF glow discharge occurring therein, and the upper value of the applicable DC voltage is as low as 100 to 1000 volts. As a result, neutral particles other than desired ions are deposited on the surface of the substrate 617 and high precision impurity doping with a prescribed concentration of impurities has been difficult to attain. In addition, since the discharge electrodes 611 and 618 act also as the acceleration electrodes, discharge becomes unstable. Accordingly, it becomes difficult to perform plasma processing such as impurity doping or etching of a substrate having a large area in a uniform manner.

SUMMARY OF THE INVENTION

An object of this invention is to provide a plasma processing apparatus capable of solving the problems described hereinbefore.

To accomplish the above object, in the present invention, a gas is introduced into a vacuum chamber, thereby forming an ion source, an RF signal is applied to two opposite electrodes having their surfaces opposed to each other through the gas to thereby generate plasma therebetween, and a magnetic field source is disposed at a required position to apply a magnetic field to the plasma, where the intensity of the magnetic field is set to be more than 1.5 times the magnetic field intensity which causes electron cyclotron resonance to occur. In a specified case where RF power has a frequency f of 13.56 MHz, the magnetic field intensity is set to be in the range from 25 gausses to 35 gausses.

The present invention is advantageous in that plasma processing such as doping of highly purified impurities into a substrate having a large area and etching of a substrate can be performed uniformly and with high precision.

BRIEF DESCRIPTION OF THE DRAWINGS

FIG. 10 is a schematic drawing showing a prior art compact ion injector wherein ions from an ion source utilizing DC glow discharge are accelerated through an ion accelerator, without being caused to pass through a mass separation unit, so as to be injected into a semiconductor substrate or the like.

DESCRIPTION OF THE PREFERRED EMBODIMENTS

Before proceeding to the detailed description of preferred embodiments of this invention, a general description of this invention will be given hereunder.

In the practical construction of a plasma processing apparatus of the present invention, an ion source comprises a first vacuum chamber having a surface made of an insulating material, RF electrodes disposed outside the first vacuum chamber and along the insulating surface thereof, a magnetic field source disposed outside the RF electrodes, and a grounded conductor disposed between the respective RF electrodes and the magnetic field source when an electromagnetic coil or electromagnetic coils are used as the magnetic field source. A substrate stand carrying a substrate to be subjected to plasma processing such as impurity doping and etching of the substrate is disposed in a second vacuum chamber.

The same effect can be obtained by an apparatus comprising a vacuum chamber in which RF electrodes, a first conductive porous plate or conductive mesh, a second conductive porous plate or conductive mesh and a substrate stand are disposed in parallel with each other, and further comprising a magnetic field source disposed outside the vacuum chamber for generating a magnetic field having a magnetic field component perpendicular to an electric field applied by the RF electrodes.

The magnetic field generated in the discharge chamber by the magnetic field source effects the confinement of electrons and excitation of cyclotron gyration of electrons, which allows RF power supplied to the RF electrodes to be used efficiently so that stable and uniform discharge can be effected even at a low gas pressure of $10^{-3}$ to $10^{-4}$ Torr. Because of the highly efficient discharge, the vacuum chamber, in which plasma is generated, can be constructed to have a surface formed of an insulating material, and the capacitance coupling RF electrodes having opposite surfaces are disposed outside the vacuum chamber and along the surface thereof formed of an insulating material to make discharge occur therethrough. The discharge caused by the RF power supplied from the RF electrodes having the opposite surfaces and by the applied magnetic field generated by the magnetic field source is highly uniform. This fact permits generation of a uniform charged particle flow or a uniform plasma flow having a desired cross-sectional form such as an elongated slit or a circle, as will be explained later.

Figure 8:
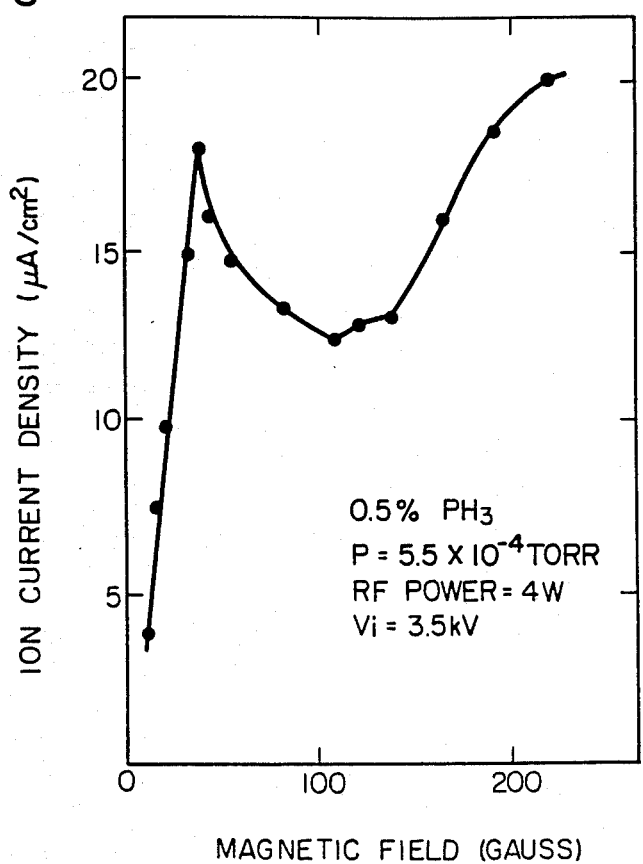
FIG. 8 is a graph showing the relation of the ion current density versus the intensity of an applied magnetic field.
Figure 9:
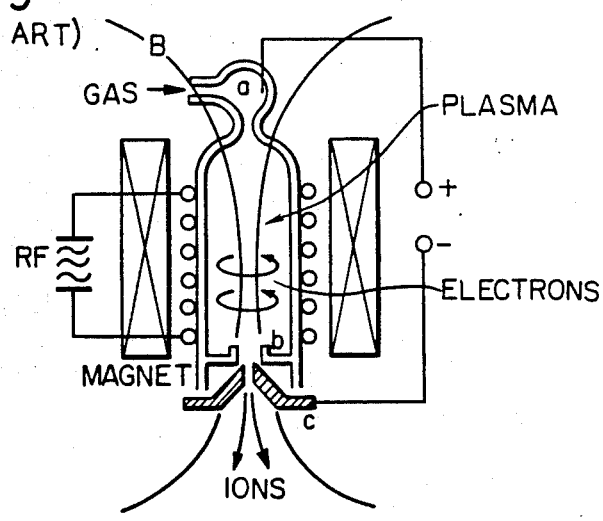
FIG. 9 is a schematic diagram showing a prior art inductance coupling RF ion source.
Figure 10:
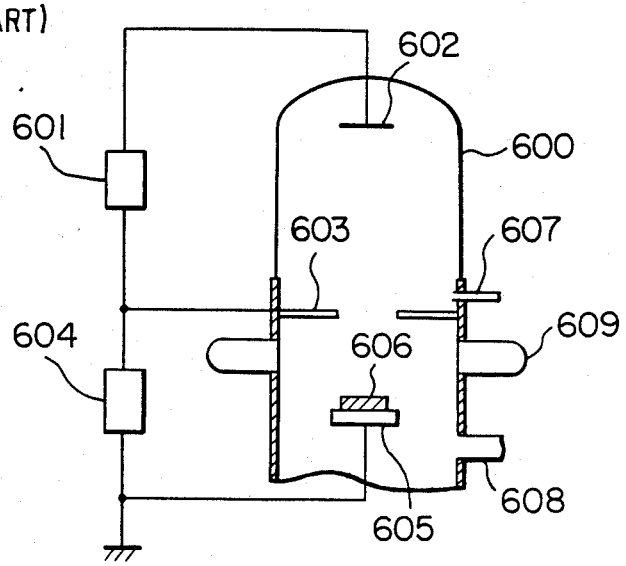
Figure 11:
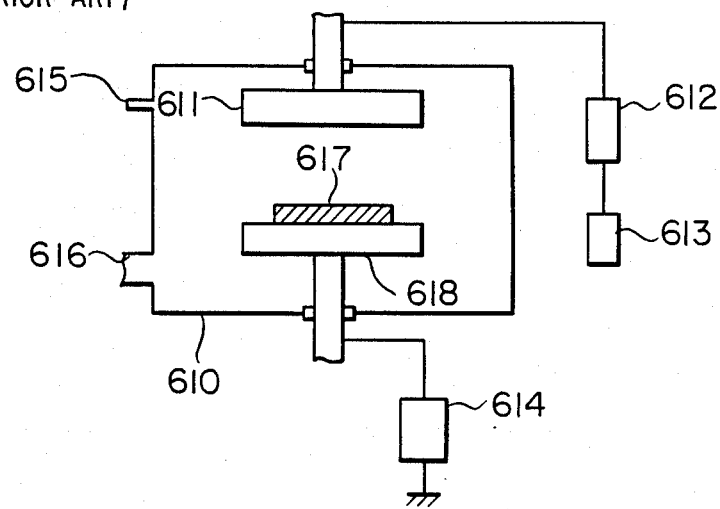
FIG. 11 is a schematic drawing illustrating a prior art plasma CVD apparatus which produces chemical vapour reaction through RF glow discharge caused by capacitance coupling RF electrodes disposed in a vacuum chamber, the RF electrodes further having a DC voltage applied thereto by the superimposition thereof on the RF energization voltage.

In this case, in order for electrons to effect cyclotron gyration at a frequency for industrial use of 13.56 MHz, for example, the application of a magnetic field, whose intensity is 4.8 gausses, is required. However, this magnetic field intensity is about 10 times the intensity of a terrestrial magnetic field, and this magnetic field intensity has not been practical, because a magnetic field of this intensity is difficult to control. Under the circumstances, the inventors of the present invention have found that the efficiency of discharge can be improved even at a magnetic field intensity of 4.8 gausses or more. The efficiency can be demonstrated by applying RF power of the frequency of 13.56 MHz to an $N_2$ gas to generate plasma and by drawing out ions from the plasma. FIG. 8 graphically illustrates the relation of the ion current density versus the intensity of an applied magnetic field. It will be seen from FIG. 8 that an increase of the ion current caused by the application of a magnetic field was observed in the range exceeding the magnetic field intensity of about 1.5 times the magnetic field intensity for causing electron cyclotron resonance. It will also be noted from FIG. 8 that the ion current density has a maximum point near a magnetic field intensity of 30 gausses which is about 6 times the electron cyclotron resonance magnetic field intensity. In addition, the inventors observed that the ion current density decreases in the range of the magnetic field intensity of 500 gausses or more. In this manner, the efficiency of discharge can be improved by optimizing the intensity of an applied magnetic field, thereby stabilizing discharge and generating ions with high efficiency.

When an electromagnetic coil is used as the magnetic field source, a grounded conductor is interposed between the respective RF electrodes and the electromagnetic coil to prevent RF power from leaking to the outside so that an induced current caused by RF power does not flow through the electromagnetic coil. This stabilizes the applied magnetic field and makes the discharge very stable and uniform even when RF power is increased. As a result, it becomes possible to obtain a plasma flow or a charged particle flow of a large diametric dimension to thereby perform plasma processing which can be effected uniformly over a large substrate area without necessitating electrical scanning of the beam.

As described previously, the application of RF power and a magnetic field makes it possible to sustain stable and uniform discharge even at a gas pressure of $10^{-3}$ to $10^{-4}$ Torr. The mean free path of ions at the $10^{-3}$ to $10^{-4}$ Torr gas pressure approximates or exceeds the distance (about 10 cm) between the discharge chamber and the substrate stand, though there is a difference dependent on the kind of ions and their energy. Therefore, with the simplified construction including the first and second electrodes disposed in the discharge chamber, the charged particles can be drawn out and accelerated so as to be transmitted to a semiconductor substrate mounted on the substrate stand and to irradiate the substrate. By virtue of the reduction of the pressure inside the apparatus to less than $10^{-3}$ Torr and the separated provision of the RF electrodes for discharging and the electrodes for acceleration, abnormal discharge such as creeping discharge and avalanche discharge, which would be caused by high pressure and high DC voltage, can be prevented, and a large diameter charged particle beam or a large diameter plasma flow can be accelerated to have 1000 eV or more. The reduction of the interior pressure to $10^{-3}$ Torr or less is also advantageous in that deposition of neutral particles other than the desired ions on the substrate surface can be avoided and high precision plasma processing such as high precision doping of impurities at a prescribed impurity concentration and high precision etching of a substrate can be performed.

The embodiments of the present invention will now be described in more detail with reference to the accompanying drawings.

Figure 1:
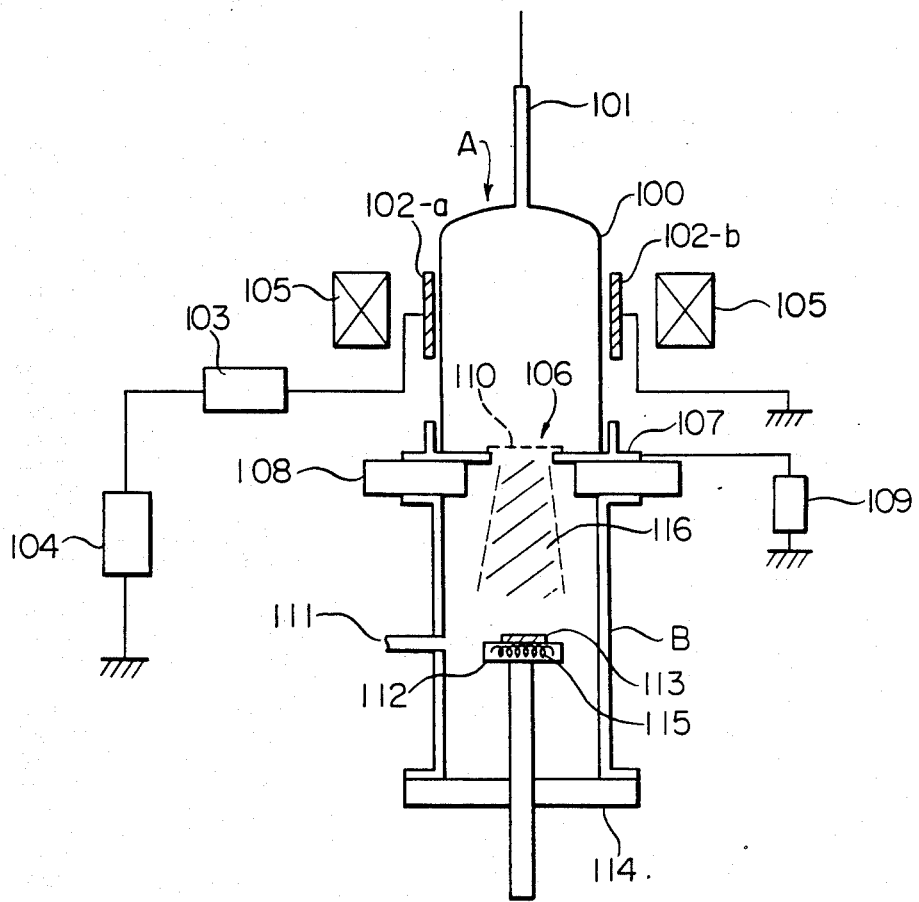
FIG. 1 is a schematic drawing illustrating a plasma processing apparatus according to a first embodiment of this invention.

Referring to FIG. 1, there is illustrated, in a schematic diagrammatic form, a plasma processing apparatus according to a first embodiment of the present invention. A discharge chamber A comprises a vacuum chamber 100 having a form of a cylindrical tube which is made of an insulating material such as quartz, glass or a ceramic. A gas is introduced into the vacuum chamber 100 through a gas inlet conduit 101. Capacitance coupling RF electrodes 102-a and 102-b are made of a metal having high conductivity such as copper or stainless steel and disposed outside the vacuum chamber 100 along a surface thereof. One capacitance coupling RF electrode 102-a is connected to an RF oscillator 104 of the frequency of 13.56 MHz via a matching box 103 with the other electrode 102-b grounded, thus supplying RF power to the interior of the vacuum chamber 100. A permanent magnet 105 is disposed outside the capacitance coupling RF electrodes 102-a and 102-b to apply a magnetic field in the tube axis direction of the cylindrical tube. Since the magnetic field effects excitation of cyclotron gyration of electrons and confinement of electrons, RF power can efficiently be used to generate plasma stably within the vacuum chamber 100 even at a relatively low pressure of $10^{-3}$ to $10^{-4}$ Torr. The intensity of this magnetic field inside the vacuum chamber 100 may be of the order of 10 to 200 gausses. The discharge chamber A is connected to a substrate chamber B through an electrode 107 having an aperture 106 and an insulating flange 108 made of, for example, teflon, a ceramic, or a vinyl chloride. The electrode 107 is connected to a power supply 109 to apply DC or AC bias. A conductive mesh 110 is applied to cover the aperture 106 and uniform capture or drawing-out of charged particles is effected over the aperture 106 by the conductive mesh 110. The substrate chamber B is in communication with a gas evacuation pipe 111 and maintained at a pressure of $10^{-3}$ to $10^{-4}$ Torr. Within the substrate chamber B, a conductive substrate stand 112 made of, for example, stainless steel, aluminum or copper is disposed and a substrate or a like material 113 such as a semiconductor substrate is mounted on the substrate stand 112. In this embodiment, the substrate stand 112 is fixedly supported within the substrate chamber B by means of an insulating flange 114 made of, for example, teflon, a ceramic or a vinyl chloride. The substrate 113 is heated by a heater 115 to raise the efficiency of plasma processing such as deposition, etching or ashing. A plasma flow 116, which is drawn out from a plasma cloud generated uniformly in the vacuum chamber 100 and is distributed uniformly over the aperture 106, irradiates the substrate 113 carried by the substrate stand 112 to perform plasma processing such as deposition of a desired amount of impurities, etching or ashing of the substrate 113.

Figure 2:
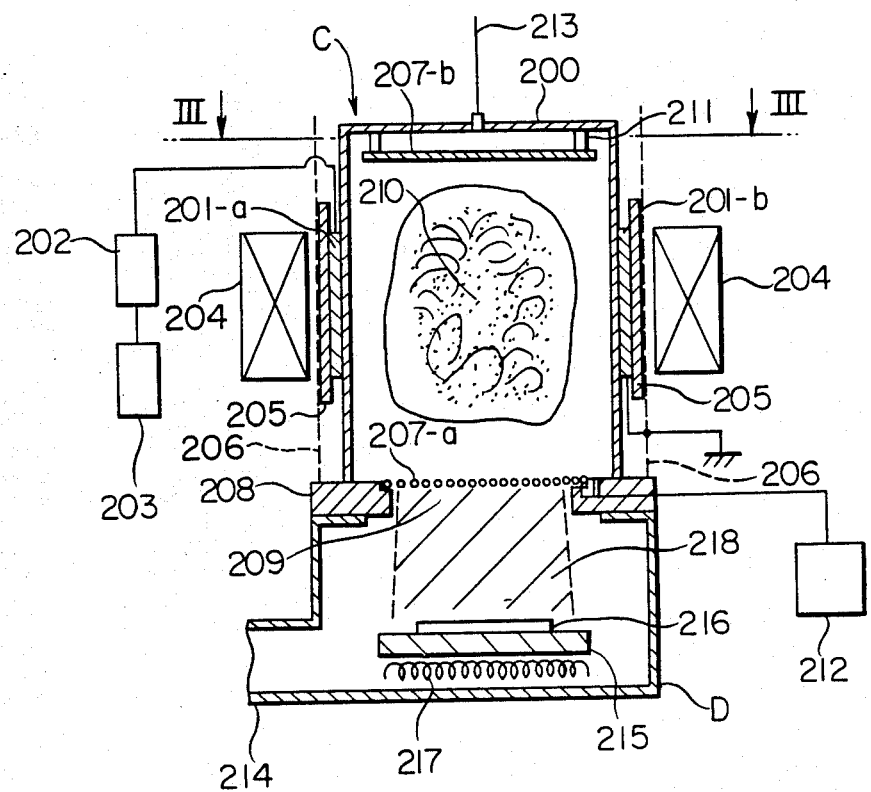
FIG. 2 is a schematic drawing illustrating a plasma processing apparatus according to a second embodiment of this invention.
Figure 3:
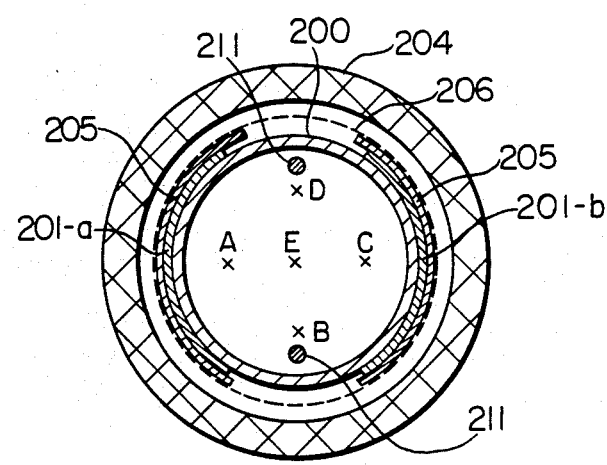
FIG. 3 is a cross-sctional view showing the discharge chamber C of the second embodiment.

Referring to FIG. 2, a plasma processing apparatus according to a second embodiment of the invention is schematically illustrated. The sectional view of a discharge chamber C of the second embodiment taken along line III—III, is shown in FIG. 3. The discharge chamber C comprises a vacuum chamber 200 having a form of a cylindrical tube which is made of an insulating material such as quartz, glass or a ceramic. Capacitance coupling electrodes 201-a and 201-b for RF glow discharge made of a high conductivity metal such as copper or stainless steel are disposed outside the vacuum chamber 200 along a surface thereof. One capacitance coupling RF glow discharge electrode 201-a is connected to an RF oscillator 203 of the frequency of 13.56 MHz via a matching box 202 with the other electrode 201-b grounded, thereby supplying RF power to the interior of the vacuum chamber 200. An electromagnetic coil 204 is disposed outside the capacitance coupling RF glow discharge electrodes 201-a and 201-b to apply a magnetic field. Since the magnetic field effects excitation of electron cyclotron gyration and electron confinement, RF power can be used efficiently to generate plasma stably within the vacuum chamber 200 even at a relatively low pressure of $10^{-3}$ to $10^{-4}$ Torr. The intensity of this magnetic field may be of the order of 10 to 200 gausses inside the vacuum chamber 200. The RF electrodes 201-a and 201-b are covered with insulating members 205 made of, for example, teflon and a conductive mesh 206 made of, for example, copper, aluminum or stainless steel is provided to be in contact with the outer surface of the insulating members 205 so that the RF electrodes 201-a and 201-b are insulated from the conductive mesh 206. This conductive mesh 206 is grounded so as to shield RF power.

Instead of using the conductive mesh 206, it is possible to use a hermetic enclosure, which is made of a nonmagnetic conductor such as stainless steel, etc. and which is grounded, for enclosing the discharge chamber C therein. The use of such a hermetic enclosure is advantageous not only in shielding RF power but also in assuring safety to provide against possible breakage of a cylindrical tube which is made of an insulating material such as quartz, glass, a ceramic, etc. and which forms the discharge chamber C.

A conductive mesh 207-a made of, for example, molybdenum, stainless steel, aluminum, titanium or tantalum and acting as a first electrode is provided to cover an aperture 209 of an insulating flange 208 made of, for example, a ceramic, teflon, acryl, a vinyl chloride or quartz. A conductive plate 207-b made of, for example, stainless steel, aluminum, titanium or tantalum and acting as a second electrode is disposed in the vacuum chamber 200 to oppose the conductive mesh 207-a through plasma 210 generated by discharge. The conductive plate 207-b is fixed to the vacuum chamber 200 by means of insulating rods 211 made of, for example, a ceramic, teflon or quartz. The conductive mesh 207-a acting as the first electrode and the conductive plate 207-b are connected across a DC high voltage power supply 212 and a voltage necessary for pushing forward and accelerating charged particles inside the discharge chamber C into a substrate chamber D is applied across the first electrode 207-a and the second electrode 207-b. A material gas is introduced into the discharge chamber C through a gas inlet conduit 213. The substrate chamber D communicates with a gas evacuation pipe 214 and is maintained at a pressure of $10^{-3}$ to $10^{-4}$ Torr. Disposed within the substrate chamber D is a conductive substrate stand 215 made of stainless steel, aluminum or copper, for example, on which a substrate or a like material 216 such as a semiconductor substrate is mounted. The substrate 216 is heated by a heater 217 to raise the efficiency of plasma processing such as impurity doping and etching. A charged particle beam 218 drawn out from plasma 210 generated uniformly within the vacuum chamber 200 has a uniform charged particle density over the aperture 209 and has kinetic energy determined by a potential difference between the first electrode 207-a and the substrate stand 215, and irradiates the substrate 216 mounted on the substrate stand 215 to apply to the substrate 216 plasma processing such as doping of a desired amount of impurities or etching.

Figure 4:
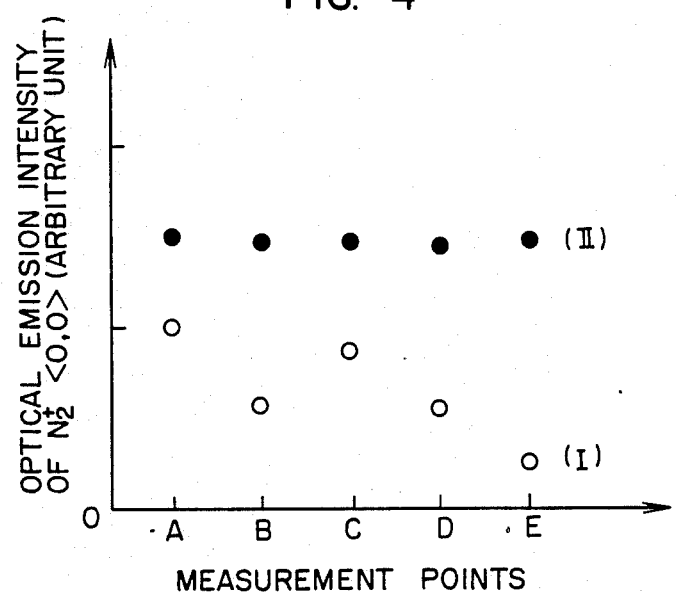
FIG. 4 is a graph illustrating the optical emission intensity of the light emitted from excited nitrogen ions ($N^+_2 <0, 0>$) at a wavelength of 392 nm obtained by the plasma optical emission spectroscopy measurement of nitrogen gas ($N_2$) plasma generated in the discharge chamber C of the second embodiment.

The optical emission intensity of the light emitted from excited nitrogen ions ($N^+_2 <0, 0>$) at a wavelength of 392 nm obtained by the plasma optical emission spectroscopy measurement (See "The Identification of Molecular Spectra" by R. W. B. Pearse and A. G. Gaydon, Chapman and Hall, London, 1984, p. 227) of nitrogen gas ($N_2$) plasma generated in the discharge chamber C of the second embodiment of the present invention is illustrated in the graph of FIG. 4. In this measurement, a vacuum chamber 200 having a tube diameter of 450 mm was used, and RF power of the frequency of 13.56 MHz and of 100 W input level and a magnetic field of the intensity of 30 Gausses were used for both the case (I) without using the conductive mesh 206, shown by small circles, and the case (II) using the conductive mesh 206, shown by black circular dots. With the conductive plate 207-b removed, a bird's eye measurement of the vacuum chamber 200 was carried out for five points A, B, C, D and E illustrated in FIG. 3. Thus, the present inventors have found that, in the case (I) without using the conductive mesh 206, the optical emission intensity becomes irregular to a great extent and the discharge is unstable, whereas, in the case (II) using the conductive mesh 206, irregularity in the optical emission intensity is suppressed and the discharge is stable. This accounts for the fact that the grounded conductive mesh 206 shields RF power to prevent an induced current caused by RF power from flowing through the electromagnetic coil so that the magnetic field inside the discharge chamber C does not vary, thereby giving rise to the generation of stable and uniform plasma. In this manner, the grounded conductive member interposed between the respective RF electrodes and the electromagnetic coil greatly contributes to the generation of stable and uniform plasma and the uniform plasma processing by the plasma processing apparatus of this invention.

Further, the inventors confirmed that, when the magnetic field intensity was raised to 50 gausses or more or reduced to 20 gausses or less, the uniformity of the optical emission intensity of the plasma was deteriorated. Especially, it was almost impossible to observe optical emission from the plasma at the measurement point E shown in FIG. 3, and this showed that uniform plasma processing could not be attained in such a condition. As a result, it was confirmed finally that the magnetic field intensity of around 30 gausses was an optimum value for performing uniform plasma processing of a substrate having a large area.

Figure 5:
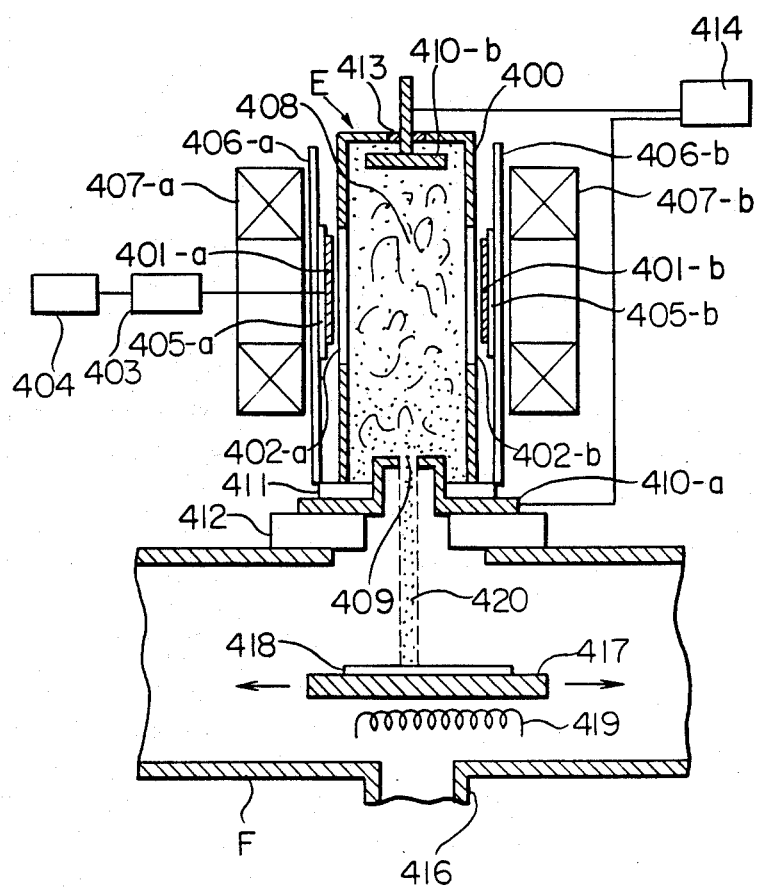
FIG. 5 is a schematic drawing showing a plasma processing apparatus according to a third embodiment of this invention.
Figure 6:
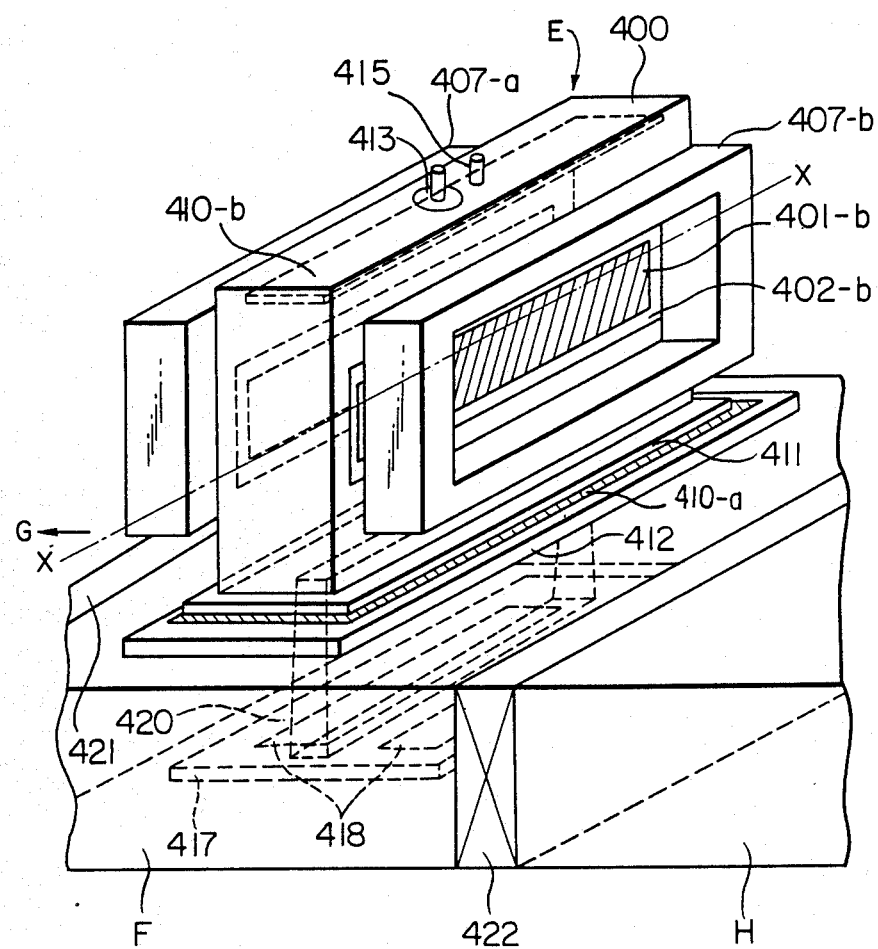
FIG. 6 is a perspective drawing schematically illustrating a supplemental modification of the apparatus of the third embodiment.

A third embodiment of a plasma processing apparatus according to this invention will now be described with reference to FIGS. 5 and 6. In the schematic illustration of FIG. 5, a discharge chamber E comprises a vacuum chamber 400 generally made of a material which is inexpensive, has high strength, and yet is easily workable, such as stainless steel, for example. However, the side wall of the vacuum chamber 400 is partly made of an insulating material permeable to RF power at surfaces 402-a and 402-b thereof covering the portions of the wall of the vacuum chamber 400 confronting capacitance coupling RF electrodes 401-a and 401-b and the neighbouring portions thereof. One of the capacitance coupling RF electrodes 401-a is connected to an RF oscillator 404 via a matching box 403, with the other capacitance coupling RF electrode 401-b grounded, thus supplying RF power into the vacuum chamber 400. Disposed respectively outside the two capacitance coupling RF electrodes 401-a and 401-b are two insulating members 405-a and 405-b, two conductive members 406-a and 406-b, and two electromagnetic coils 407-a and 407-b. Since a composite magnetic field generated by the two electromagnetic coils 407-a and 407-b effects excitation of electron cyclotron gyration and confinement of electrons, plasma 408 can be generated stably even at a low pressure of $10^{-3}$ to $10^{-4}$ Torr. The magnetic field intensity may be of the order of 10 to 200 gausses within the vacuum chamber 400. Alternatively, magnets may be used as the magnetic field source and in this case the insulating members 405-a and 405-b and the conductive members 406-a and 406-b can be eliminated. A first electrode 410-a has an elongated slit-like aperture 409 and is interposed between the discharge chamber E and a substrate chamber F through insulating flanges 411 and 412. Within the vacuum chamber 400, a second electrode 410-b is disposed to oppose the first electrode 410-a through the plasma 408 generated by the discharge. The second electrode 410-b is secured to the vacuum chamber 400 through an insulating flange 413. The first and second electrodes 410-a and 410-b are connected across a DC high voltage power supply 414, and a voltage for pushing forward and accelerating charged particles inside the discharge chamber E into the substrate chamber F is applied across the electrodes 410-a and 410-b. A material gas is introduced into the discharge chamber E through a gas inlet conduit 415 shown in FIG. 6. The substrate chamber F is a vacuum chamber which is in communication with a gas evacuation pipe 416 and maintained at a pressure of $10^{-3}$ to $10^{-6}$ Torr. Disposed within the substrate chamber F is movable substrate stand 417 made of, for example, stainless steel, aluminum or copper on which a substrate or like material 418 such as a semiconductor substrate is placed. The substrate 418 is heated by a heater 419 to raise the efficiency of plasma processing such as doping of impurities or etching. A charged particle beam 420, which is drawn out from the plasma 408 generated uniformly between the capacitance coupling RF electrodes 401-a and 401-b and in the longitudinal direction along an X—X axis shown in FIG. 6 within the vacuum chamber 400, has a charged particle density which is uniform over the elongated slit-like aperture 409 in the X—X axis direction and has kinetic energy determined by a potential difference between the first electrode 410-a and the substrate stand 417. This charged particle beam 420 irradiates the substrate 418 mounted on the substrate stand 417 to perform plasma processing of the substrate 418, such as doping therein a desired amount of impurities and etching thereof.

Further, by moving the movable substrate stand 417 in both directions (indicated by the arrows in FIG. 5) perpendicularly to the longitudinal direction of the irradiation surface of the charged particle beam 420, namely, in the directions perpendicular to the X—X axis direction, plasma processing such as doping of impurities or etching can be applied very uniformly to a substrate having a large area.

A supplemental modification of the third embodiment will now be described with reference to the schematic perspective view shown in FIG. 6. In this supplemental modification of the third embodiment, the construction of an upper portion of this apparatus including the discharge chamber E is identical with the corresponding portion of the apparatus shown in FIG. 5. Only, however, the substrate chamber F communicates with another vacuum chamber G and another plasma processing apparatus H through gate valves 421 and 422, respectively. By moving the substrate stand 417 from the substrate chamber F to the vacuum chamber G or the plasma processing apparatus H, it is made possible to perform pre-processing or post-processing of the plasma processing such as impurity doping and etching of the substrate 418, other plasma processings such as doping of different impurities and etching, loading and unloading of a substrate, etc. can be carried out without substantially deteriorating the evacuated condition of the discharge chamber E and the substrate chamber F.

Figure 7:
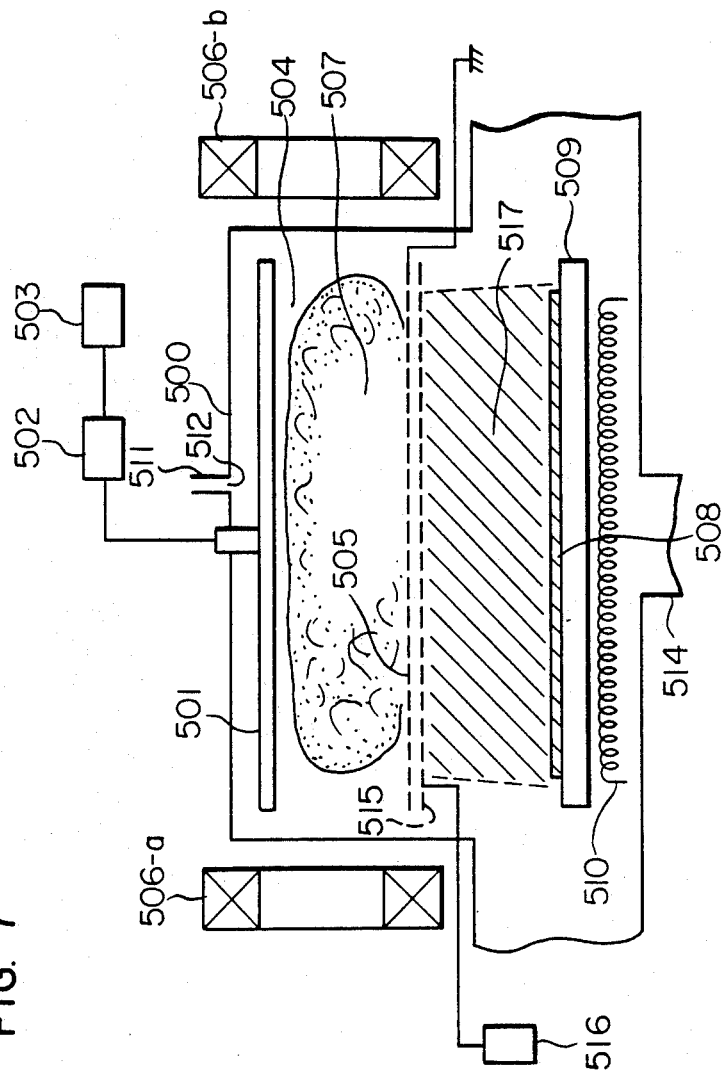
FIG. 7 is a schematic drawing illustrating a plasma processing apparatus according to a fourth embodiment of this invention.

Referring to FIG. 7, there is illustrated schematically a plasma processing apparatus according to a fourth embodiment of the present invention. A first electrode 501 made of a high conductivity metal such as copper, nickel, aluminum or stainless steel is supported within a vacuum chamber 500 made of a conductor, such as stainless steel, etc., and is connected to an RF oscillator 503 via a matching box 502. A grounded first conductive mesh 505 is spaced apart from the first electrode 501 in parallel therewith through a predetermined space 504. The electrode 501 and the first conductive mesh 505 act as capacitance coupling RF electrodes to supply RF power to the space 504. Two electromagnetic coils 506-a and 506-b are disposed respectively outside the vacuum chamber 500. Since a composite magnetic field generated by the two electromagnetic coils 506-a and 506-b performs excitation of electron cyclotron gyration and confinement of electrons, plasma 507 can be generated stably within the space 504 even at a low pressure of $10^{-3}$ to $10^{-4}$ Torr. The magnetic field intensity within the vacuum chamber 500 may be of the order of 10 to 200 guasses. RF power in this case can be shielded by the vacuum chamber, so that the flow of an induced current through the electromagnetic coils can be prevented, thereby allowing the magnetic field intensity to be controlled at a desired value with high precision so as to assure stable discharge. Alternatively, permanent magnets may be used as the magnetic field source in place of the electromagnetic coils 506-a and 506-b. A second conductive mesh 515 made of a high conductivity metal such as copper, nickel, aluminum or stainless steel is disposed in parallel with the first conductive mesh 505 in an electrically insulated state. The second conductive mesh 515 is connected to a power supply 516 and is applied with a DC or AC bias. The applied bias is effective for performing capture or drawing out of charged particles 517 uniformly over the second conductive mesh 515. The charged particles 517 are transmitted passing through the second conductive mesh 515 and irradiate a substrate 508 having a large area mounted on a substrate stand 509 to thereby perform plasma processing such as uniform impurity doping and etching of the substrate 508 having a large area. The introduction of a gas into the vacuum chamber 500 is effected through a gas inlet opening 512 of a gas inlet conduit 511. Reference numerals 510 and 514 designate a heater for heating the substrate 508 and an evacuation pipe, respectively.

Further, a protective surface coating made of silicon oxide, silicon nitride, etc. is provided on a surface of each of the first electrode 501, the first conductive mesh 505 and the second conductive mesh 515 which surface is exposed to charged particles generated in the vacuum chamber 500. This protective surface coating serves to prevent the substrate 508 from being contaminated by the spattering of electrode metal particles from the respective electrodes.

Meritorious effects obtainable by the plasma processing apparatus of the present invention are summarized below.

In the first place, the magnetic field source produces in the discharge chamber a magnetic field which effects excitation of electron cyclotron gyration and confinement of electrons, and consequently RF power supplied from the RF electrodes can be used efficiently to assure stable and uniform discharge even at a low gas pressure of $10^{-3}$ to $10^{-4}$ Torr. By virtue of the highly efficient discharge, the vacuum chamber, in which plasma is generated, can have a surface made of an insulating material and the capacitance coupling RF electrodes having opposite surfaces can be disposed outside the vacuum chamber along the insulating surface thereof to cause discharge to occur in the vacuum chamber. The discharge effected not only by RF power supplied from the RF electrodes having the opposite surfaces but also by the magnetic field generated in the vacuum chamber can be highly uniform (See FIG. 4). Especially, with RF power of the frequency of 13.56 MHz, efficiency (FIG. 8) and uniformity (FIG. 4) of the discharge can be optimized at the magnetic field intensity of around 30 Gausses. This permits the generation of a uniform charged particle flow or a uniform plasma flow having a desired cross-sectional form such as an elongated slit or a circle as described with respect to the foregoing embodiments (FIGS. 1 to 7).

In the second place, where the electromagnetic coil is used as the magnetic field source, a grounded conductor is advantageously interposed between the respective RF electrodes and the electromagnetic coil to prevent RF power from leaking to the outside, so that an induced current caused by RF power does not flow through the electromagnetic coil. This stabilizes the applied magnetic field and makes discharge very stable and uniform even when RF power is increased. Thus, a plasma flow or a charged particle flow having a large diametric dimension can be obtained (FIGS. 2 to 7) to thereby ensure plasma processing, which is uniform over a large area, without requiring electrical scanning of the beam.

In the third place, by virtue of the reduction of the pressure inside the apparatus to less than $10^{-2}$ Torr and the separation of the RF electrode for discharging and the electrode for acceleration, abnormal discharge such as creeping discharge and avalanche discharge caused by a high pressure and a high DC voltage can be prevented, and a large diameter charged particle beam or a large diameter plasma flow having 1000 eV or more energy can be obtained (FIGS. 1 to 7) for performing plasma processing such as doping of impurities or etching of a substrate.

In the fourth place, where a portion of the discharge chamber connected to the substrate chamber has a large aperture, a conductive mesh or a conductive porous plate is used to cover the aperture, thereby ensuring the application of uniform plasma processing to a large area substrate.

In the fifth place, where the discharge chamber has an elongated slit-like aperture, a movable substrate stand is moved perpendicularly to the longitudinal direction of the aperture, thereby enabling the application of uniform plasma processing to a large area substrate.

The above effects can also be attained in the cases where a DC or AC voltage is applied to the substrate stand, a gas inlet conduit is additonally connected to the substrate chamber, and a gas evacuation pipe is additionally connected to the discharge chamber.

As described above, the plasma processing apparatus of the present invention has high utilization advantages in that plasma processing such as doping of highly purified impurities into a substrate and etching of a substrate during the production of semiconductor devices of a large size such as elongated image sensors and thin film transistor arrays having a large area, for example, can be carried out collectively, uniformly, with high precision and within a short period of time.

We claim:

1. An ion irradiation processing apparatus comprising:
    a discharge chamber including
        a first vacuum chamber having an outer surface formed of an insulating material,
        RF electrodes disposed outside said first vacuum chamber and along said outer surface thereof, said RF electrodes being supplied with RF power, and
        a magnetic field source disposed at a predetermined position outside said first vacuum chamber, said RF electrodes and said magnetic field source comprising means for generating a ion plasma within said first vacuum chamber
    a substrate chamber including
        a second vacuum chamber in communication with said discharge chamber, and
        a substrate stand mounted within said second vacuum chamber; and
    biasing means for causing ions from said plasma to uniformly irradiate said substrate stand in said substrate chamber, said biasing means including
        a first electrode, having an aperture, interposed between said substrate chamber and said discharge chamber, said first electrode being electrically insulated from said substrate chamber and said discharge chamber, and
        a second electrode disposed in said discharge chamber opposite to and spaced apart from said first electrode, said first and said second electrodes being connected across a voltage source.

2. An apparatus according to claim 1, further comprising a conductive mesh partially covering said aperture of said first electrode.

3. An apparatus according to claim 1, further comprising a conductive porous plate partially covering said aperture of said first electrode.

4. An apparatus according to claim 1, wherein said discharge chamber further comprises a grounded shield separating said RF electrodes from said magnetic field source.

5. An apparatus according to claim 4, further comprising an insulating member interposed between said RF electrodes and said grounded shield.

6. An apparatus according to claim 5, further comprising a hermetic enclosure disposed outside said electromagnetic coil enclosing said first vacuum chamber.

7. An apparatus according to claim 6, further comprising an insulating member interposed between said RF electrodes and said grounded shield.

8. An apparatus according to claim 1, wherein said first vacuum chamber is comprised of a cylindrical tube made of an insulating material.

9. An apparatus according in claim 1, wherein said first vacuum chamber includes first and second elongated opposing parallel surfaces.

10. An ion irradiation processing apparatus comprising:
    a discharge chamber including a first vacuum chamber containing therein a first electrode, a first conductive porous plate, and a second conductive porous plate, said electrode and said plates being connected to a voltage source, with said first electrode, said first conductive porous plate, and said second conductive porous plate being arranged parallel with one another;
    a substrate chamber comprised of a second vacuum chamber communicating with said discharge chamber, said second vacuum chamber containing therein a substrate stand arranged in parallel with said second conductive porous plate;
    an RF power source connected to said first electrode and said first porous plate for applying RF power across said first electrode and said first conductive porous plate; and
    a magnetic field source disposed outside said discharge chamber.

11. An apparatus according to claim 10, wherein said first conductive porous plate is formed by a conductive mesh.

12. An apparatus according to claim 10, wherein said second conductive porous plate is formed by a conductive mesh.

13. An apparatus according to claim 11, wherein said second conductive porous plate is formed by a conductive mesh.

14. An apparatus according to claim 1, wherein said magnetic field source provides a magnetic field in said discharge chamber of 500 gauss or less.

15. An apparatus according to claim 10, wherein said magnetic field source provides a magnetic field in said discharge chamber of 500 gauss or less.

16. An apparatus according to claim 1, wherein said magnetic field source provides a magnetic field in said discharge chamber in the range of 25 to 35 gauss.

17. An apparatus according to claim 10, wherein said magnetic field source provides a magnetic field in said discharge chamber in the range of 25 to 35 gauss.

18. An apparatus according to claim 1, wherein said discharge chamber and said substrate chamber are maintained at a pressure of 0.1 Torr or less.

19. An apparatus according to claim 10, wherein pressure in said discharge chamber and said substrate chamber are maintained at a pressure of is 0.1 Torr or less.

* * * * *